United States Patent [19]

Nishinoiri et al.

[11] Patent Number: 5,153,097
[45] Date of Patent: Oct. 6, 1992

[54] LIGHT-SENSITIVE MATERIAL FOR LITHOGRAPHIC PRINTING PLATE AND PROCESS FOR MAKING PRINTING PLATE

[75] Inventors: Hiroshi Nishinoiri; Yoshikazu Takaya; Yasuo Tsubai; Toshiro Kondo, all of Nagaokakyo, Japan

[73] Assignee: Mitsubishi Paper Mills Limited, Tokyo, Japan

[21] Appl. No.: 747,491

[22] Filed: Aug. 19, 1991

Related U.S. Application Data

[63] Continuation of Ser. No. 314,105, Feb. 23, 1989, abandoned.

Foreign Application Priority Data

Mar. 3, 1988 [JP] Japan ................... 63-50667
Mar. 3, 1988 [JP] Japan ................... 63-50668

[51] Int. Cl.$^5$ .................... G03C 5/54; G03F 7/06
[52] U.S. Cl. .......................... 430/204; 430/9; 430/227; 430/229
[58] Field of Search ............. 430/204, 227, 229, 9, 430/944

[56] References Cited

U.S. PATENT DOCUMENTS

| | | | |
|---|---|---|---|
| 3,904,412 | 9/1975 | Serrien et al. | 430/204 |
| 4,144,064 | 3/1979 | Vermeulen et al. | 430/204 |
| 4,217,408 | 8/1980 | Kubotera et al. | 430/227 |
| 4,297,429 | 10/1981 | Kanada et al. | 430/408 |
| 4,297,430 | 10/1981 | Kanada et al. | 430/204 |
| 4,454,216 | 6/1984 | Horii et al. | 430/204 |
| 4,501,811 | 2/1985 | Saikawa et al. | 430/246 |
| 4,770,961 | 9/1988 | Tanada et al. | 430/204 |
| 4,873,170 | 10/1989 | Nishinoiri et al. | 430/204 |
| 4,892,812 | 1/1990 | Kohmura et al. | 430/606 |

Primary Examiner—Charles L. Bowers, Jr.
Assistant Examiner—Thorl Chea
Attorney, Agent, or Firm—Cushman, Darby & Cushman

[57] ABSTRACT

The invention provides a light-sensitive material for making lithographic printing plate through high-intensity short-time exposure which comprises a support and, provided thereon, at least a silver halide emulsion layer and a physical development nuclei layer wherein an intermediate layer comprising a water-permeable film forming polymer is provided between the emulsion layer and the nuclei layer. Furthermore, a process for making a lithographic printing plate from said light-sensitive material is provided which comprises subjecting the light-sensitive material to imagewise exposure of high intensity short time, silver complex diffusion transfer development and subsequently treatment with an oxidizing agent for silver and an oleophilic organic compound.

11 Claims, No Drawings

LIGHT-SENSITIVE MATERIAL FOR LITHOGRAPHIC PRINTING PLATE AND PROCESS FOR MAKING PRINTING PLATE

This is a continuation of application Ser. No. 07/314,105, filed on Feb. 23, 1989, was abandoned upon the filling hereof.

BACKGROUND OF THE INVENTION

The present invention relates to a light-sensitive material for making lithographic printing plates which is suitable to be exposed with a laser beam as a light source and in particular to a lithographic printing plate and a method for making the printing plate by silver complex diffusion transfer process.

A lithographic printing plate which utilizes directly as ink receptive areas a transferred silver image produced by silver complex diffusion transfer process has been known by the disclosures of U.S. Pat. Nos. 3,728,114 and 4,134,769.

In a typical embodiment of the silver complex diffusion transfer process suitable for making lithographic printing plate, a silver image is formed in the following manner. When a light-sensitive material comprising a support and, provided thereon, a subbing layer which serves also as antihalation layer, a silver halide emulsion layer and a physical development nuclei layer is imagewise exposed and developed, the silver halide in the areas where a latent image has been formed changes into blackened silver in the emulsion layer. At the same time, the silver halide in the areas where a latent image has not been formed dissolves by the action of a silver halide complexing agent contained in the developer and diffuses towards the surface. The dissolved and diffused silver complex is precipitated by the reducing action of the developing agent on the physical development nuclei in the surface layer to form a silver image. After the development, if necessary, the silver image is subjected to sensitization treatment to enhance its ink receptivity. The material thus treated is mounted on an offset printing machine and the inked image is transferred to a print material.

In the conventional process, the silver halide emulsion layer is spectrally sensitized with a merocyanine dye or cyanine dye so as to show a sensitivity maximum at around 550 nm in the green region and subjected to exposure in a process camera to an ordinary light source such as a tungsten bulb for several seconds to several ten seconds. A printing plate made in this way exhibited only limited sharpness and resolving power, even though an aforementioned light-sensitive material inherently excellent in these properties has been used.

Besides, in reproducing a color print from a color original, the conventional process has disadvantages in that both procedures of preparing the sensitive material and making a printing plate are troublesome in addition to the insufficient resolving power.

At present, making a printing plate using laser beam and the like has been proposed as one method to solve the above-mentioned problems. U.S. Pat. No. 4,501,811 and the like disclose lithographic printing plates made using helium-neon laser, light-emitting diodes (LED), argon laser or semiconductor laser.

However, lithographic printing plates made by a high-intensity short-time exposure such as lasers in accordance with a scanning exposure technique are still insufficient in characteristics such as sensitivity, contrast, resolution, shelf stability and printing endurance and further improvements in these respects are required.

The inventors have found the surprising fact that the above-mentioned characteristics can be markedly improved in light-sensitive materials for lithographic printing plate which is to be subjected to high-intensity short-time (less than $10^{-4}$ second) such as by a laser.

SUMMARY OF THE INVENTION

The object of the present invention is to provide a light-sensitive material for lithographic printing plates high in sensitivity, contrast and shelf stability which is subjected to high-intensity short-time exposure.

DESCRIPTION OF THE INVENTION

The above object has been attained by a light-sensitive material for lithographic printing plates which is subjected to high-intensity short-time exposure and which comprises a support and at least a silver halide emulsion layer and a physical development nuclei layer provided on the support, characterized in that an intermediate layer comprising a water permeable film-forming polymer is provided between the emulsion layer and the nuclei layer.

From the points of coatability and adhesion of the physical development nuclei layer, gelatin is especially preferred as the water permeable film-forming polymer. However, as far as it is a polymer capable of permeating a developing solution and it per se has film-forming ability (namely, water permeable film-forming polymer), there may be used other polymers such as polyvinyl alcohol, carboxymethylcellulose, hydroxyethylcellulose, gum arabic, sodium alginate, hydroxyethylstarch, dialdehydestarch, dextrin, polystyrenesulfonic acid, styrene-maleic anhydride copolymer, and acrylic acid-maleic anhydride copolymer. Gelatin includes any of lime-treated gelatin, acid-treated gelatin and various gelatin derivatives.

It is not clear why the intermediate layer of the present invention has the effects of sensitization and enhancement of contrast. From the facts that such effects cannot be exhibited with low intensity exposure by ordinary process camera and that the effects cannot also be exhibited by increasing amount of polymer binder in the emulsion layer and the physical development nuclei layer without providing the intermediate layer, it can be considered that the balances among formation of latent image by high intensity exposure, physical development (formation, diffusion and reduction of silver complex) and chemical development together take part in the production of the effects.

Regarding amount of the polymer used in the intermediate layer, effects of the present invention increase with increase of the amount to a certain level, but when it is too much, amount of the transferred and precipitated silver decreases. Therefore, optimum amount should be determined depending on conditions. In general, amount of the polymer may be about 0.01 g to about 2 g, preferably about 0.05 g to about 1.5 g per 1 m².

The intermediate layer may contain normally required compounds such as surfactant and hardener. If necessary, the intermediate layer may be divided into two or more layers. The intermediate layer may be coated simultaneously with or separately from coating of silver halide emulsion layer.

The silver halide emulsion of the light-sensitive material for lithographic printing plate is spectrally sensitized with a sensitizing dye suitable to wavelength of light source. For suitable sensitizing dyes, the aforementioned patent specifications can be referred to.

Sensitizing dyes represented by the following formula(I) are preferred for light sources such as argon laser helium-neon laser, CRT and LED.

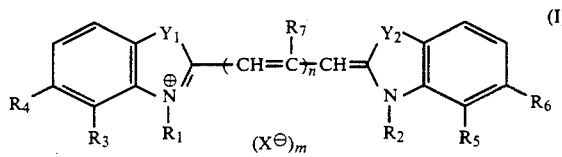

wherein $R_1$ and $R_2$ each represents an alkyl group, an alkenyl group, an aryl group or an aralkyl group, at least one of $R_1$ and $R_2$ is a substituted alkyl group having a sulfo group or a carboxyl group; $R_3$-$R_6$ each represents a hydrogen atom, an alkyl group, an alkoxy group, an aryl group, a hydroxyl group, an alkoxycarbonyl group or a halogen atom, $R_3$ and $R_4$ or $R_5$ and $R_6$ may jointly form a benzene ring; $R_7$ represents an alkyl group, an aryl group or an aralkyl group; $Y_1$ and $Y_2$ each represents an O atom, an S atom, an Se atom or N-$R_8$ ($R_8$ is a lower alkyl group); X represents a cation such as hydrogen, an alkali metal or ammonium; and m and n represents 1 or 0.

Typical examples of the sensitizing dyes are enumerated below.

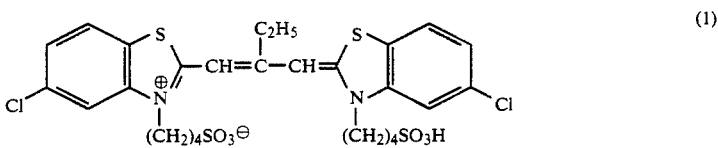

(1)

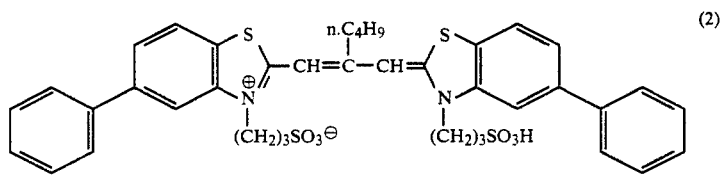

(2)

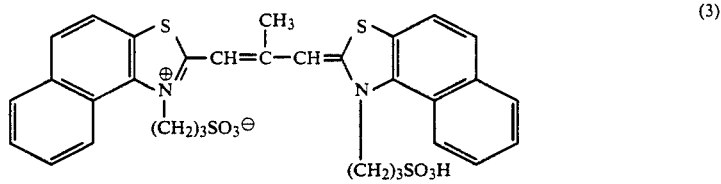

(3)

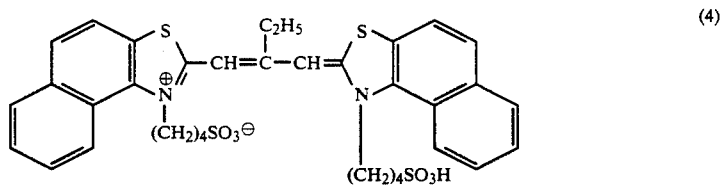

(4)

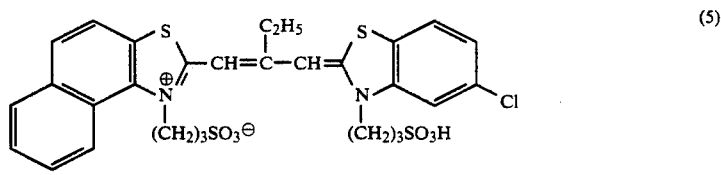

(5)

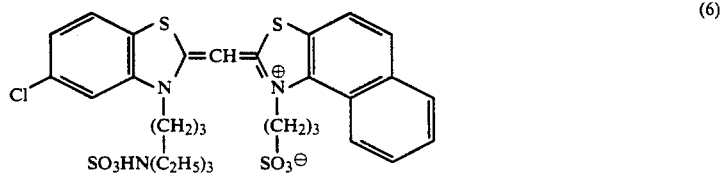

(6)

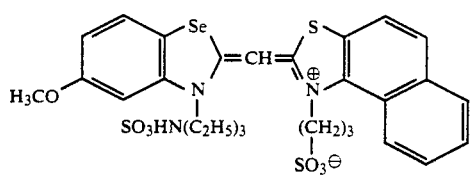
(7)

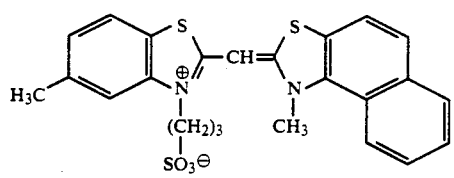
(8)

For semiconductor laser, there may be used sensitizing dyes which show a sensitive maximum in the region of 700 nm or longer. Preferred are sensitizing dyes represented by the following formulas (II)–(V).

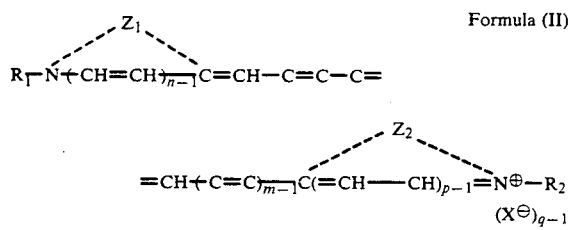

Formula (II)

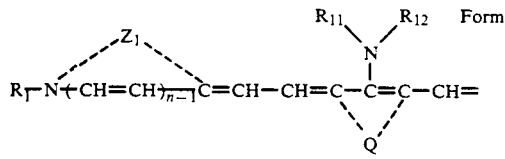

Formula (III)

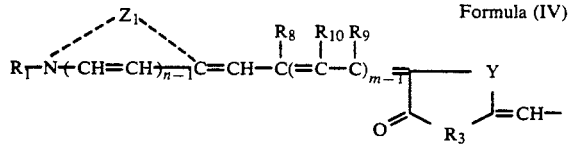

Formula (IV)

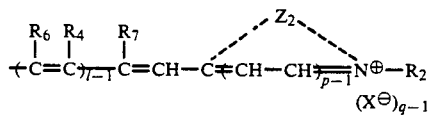

Formula (V)

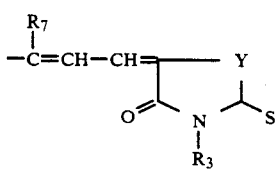

In the above formulas (II)-(V), $Z_1$ and $Z_2$ which may be identical or different each represents a group of atoms necessary to form a 5- or 6-membered nitrogen-containing heterocyclic ring; $R_1$ and $R_2$ which may be identical or different each represents an alkyl group or an alkenyl group; $R_3$ represents an alkyl group, an alkenyl group or an aryl group; $R_4$–$R_{10}$ which may be identical or different each represents a hydrogen atom, a halogen atom, an alkyl group, an aryl group or an alkoxy group and $R_6$ and $R_7$ or $R_8$ and $R_9$ may link to each other to form a 5- or 6-membered ring; $R_{11}$ and $R_{12}$ which may be identical or different each represents an alkyl group or an aryl group and $R_{11}$ and $R_{12}$ may link to each other to form a 5- or 6-membered ring; Y represents a sulfur atom, an oxygen atom or N-$R_{13}$ ($R_{13}$ is an alkyl group); Q represents a group of atoms necessary to form a 5- or 6-membered ring; X represents an acid anion; and l, m, n, p and q each represents 1 or 2. Typical examples of the sensitizing dyes are as follows:

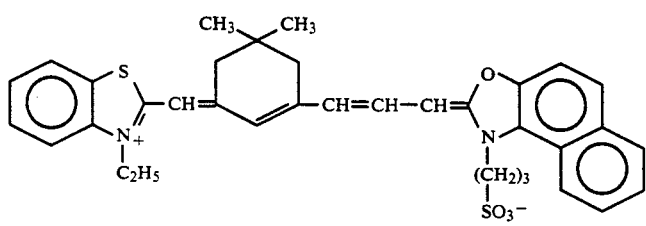
(9)

-continued

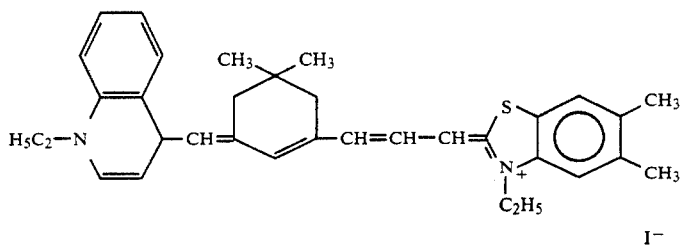
(10)

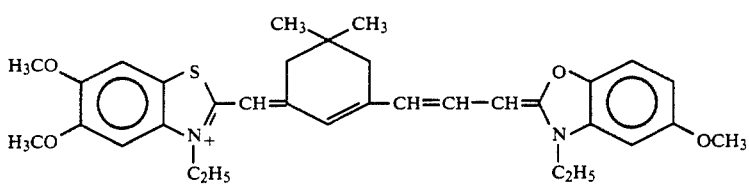
(11)

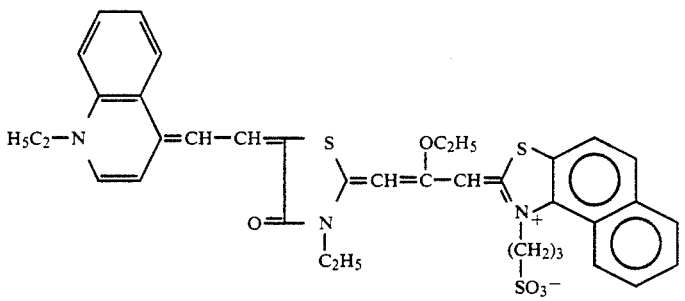
(12)

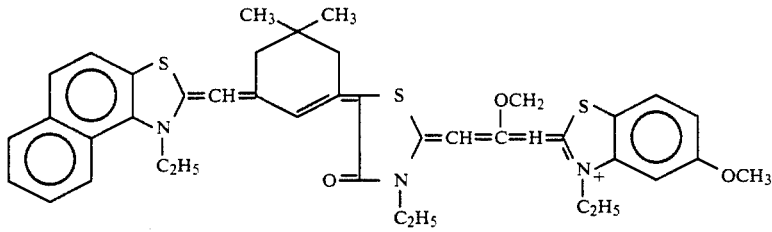
(13)

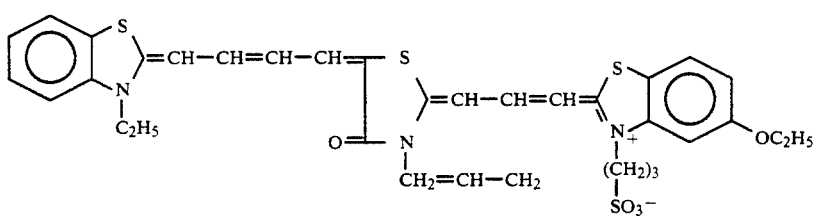
(14)

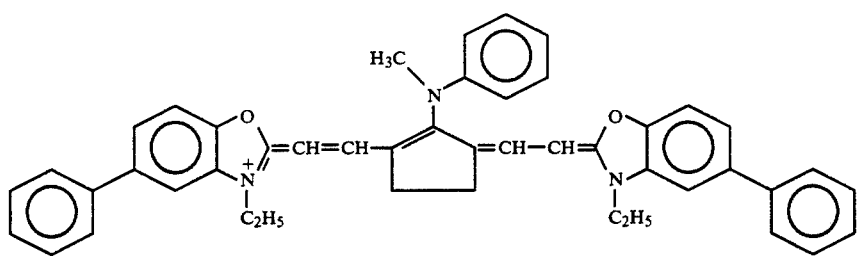
(15)

The sensitizing dyes used in the present invention can be synthesized by the methods known to the art. They can be added to the silver halide emulsion at any time before coating the emulsion. Addition amount can vary in a wide range, but is $1\times10^{-5}$–$1\times10^{-2}$ mol per 1 mol of silver halide for obtaining good results. Optimum amount varies depending on conditions of silver halide emulsion, for example, composition of halogen, average grain size and crystal habit of silver halide grains.

The silver halide emulsion for use in the light-sensitive material for lithographic printing plate may be silver chloride, silver bromide, silver chlorobromide, silver chloriiodide, silver chlorobromoiodide, etc. and preferred are silver halides containing at least 50 mol% of silver chloride. Average grain size of these silver halides is preferably 0.2–0.8 micron, though other grain sizes are usable. The emulsion is preferably monodispersion of silver halide grains, 90% or more of total grains having a size within ±30% of the average size. The grains are preferably in the form of substantially cube or fourteen faces polyhedron, though those having other crystal habits can also be used.

The binder used in the silver halide emulsion in the light-sensitive material for lithographic printing plate of the present invention is usually gelatin which can be partially replaced with one or more hydrophilic polymer binders such as starch, albumin, sodium alginate, hydroxyethylcellulose, gum arabic, polyvinyl alcohol, polyvinyl pyrrolidone, carboxymethylcellulose, polyacrylamide, styrenemaleic anhydride copolymer, and polyvinylmethyl ethermaleic anhydride copolymer. An aqueous dispersion (latex) of vinyl polymers can also be used.

The silver halide emulsion can be sensitized by various methods during its preparation or coating. The emulsion is preferably sensitized chemically by the methods well known to the art by using, for example, sodium thiosulfate, alkylthioureas, or gold compounds such as gold rhodanide and gold chloride or mixture thereof.

Furthermore, the characteristics such as high sensitivity, high sharpness and high resolving power which are especially desired for the materials for direct plate making can be obtained by using at any time during preparation of silver halide emulsion compounds of metals of Group VIII of the periodic table, such as salts of cobalt, nickel, rhodium, palladium, iridium, and platinum. Addition amount of these compounds is in the range of $10^{-8}$–$10^{-3}$ mol for one mol of silver halide. The silver halide emulsion layer may contain other ordinary additives such as coating aids, hardeners, antifoggants, matting agents (water-holding agents), and developing agents.

Underneath the silver halide emulsion layer, (i.e., on the support), there may be provided a subbing layer to improve adhesion or undercoating layer which may contain a colorant such as carbon black or a light absorbing compound and which may also contain a developing agent or matting agent.

The light-sensitive material to which the DTR process is applied has an image receiving layer containing physical development nuclei. This image receiving layer can be provided underneath the silver halide emulsion layer. In this case, the material is imagewise exposed and DTR developed and thereafter the silver halide emulsion layer and the intermediate layer are removed to make a lithographic printing plate. Especially preferably, the image receiving layer is provided over the silver halide emulsion layer, namely, as an outermost surface layer through the intermediate layer.

As the physical development nuclei, there may be used known ones, for example, metals such as antimony, bismuth, cadmium, cobalt, palladium, nickel, silver, lead and zinc and sulfides thereof. The image receiving layer may contain one or more hydrophilic colloids such as gelatin, carboxymethylcellulose, gum arabic, sodium alginate, hydroxyethylstarch, dialdehydestarch, dextrin, hydroxyethylcellulose, polystyrenesulfonic acid, vinylimidazole-acrylamide copolymer and polyvinyl alcohol. In the case of lithographic printing plate having the image receiving layer as a surface layer, amount of the hydrophilic colloid contained in the image receiving layer is preferably 0.5 g/m² or less.

The image receiving layer may contain hygroscopic substances or wetting agent such as sorbitol and glycerol. The image receiving layer may further contain pigments for scumming prevention such as barium sulfate, titanium dioxide, China clay and silver, developing agent such as hydroquinone and hardeners such as formaldehyde and dichloro-S-triazine.

Supports can be paper; films such as cellulose acetate film, polyvinyl acetal film, polystyrene film, polypropylene film, polyethylene terephthalate film; composite films such as polyester, polypropylene or polystyrene film coated with polyethylene film; metals; metallized paper; or metal/paper laminates. A paper support coated on or both sides with an α-olefin polymer such as polyethylene is also useful. These supports may contain an antihalation compound.

Development processing solution used in the present invention may contain alkaline substances such as sodium hydroxide, potassium hydroxide, lithium hydroxide, and trisodium phosphate; preservatives such as sulfites; silver halide solvents such as thiosulfates, thiocyanates, cyclic imides, thiosalicylic acid, and amines; thickening agents such as hydroxyethyl cellulose and carboxymethyl cellulose; anti-foggants such as potassium bromide, 1-phenyl-5-mercaptotetrazole and compounds mentioned in Japanese Patent Kokai No. 47-26201, developing agents such as hydroquinone and 1-phenyl-3-pyrazolidone and development modifiers such as polyoxyalkylene compounds and onium compounds.

In carrying out silver complex diffusion transfer process, a developing agent can be contained in silver halide emulsion layer and/or image receiving layer or other water-permeable layers contiguous to the image receiving layer as disclosed in British Patent Nos. 1,000,115, 1,012,476, 1,017,273 and 1,042,477. Therefore, in case of such materials, the processing-solution used in development can be a so-called "alkaline activating solution" containing no developing agent.

The above-mentioned photographic characteristics and printing characteristics can be further improved by surface treating the developed material with an oxidizing agent for silver and an oleophilic organic compound. These compounds are preferably contained in a same processing solution, but may also be contained in separate processing solutions.

The oxidizing agents used in the present invention are those which are disclosed in the above-mentioned Japanese Patent Kokai No. 55-98753, namely, those exemplified below.

(1) Secondary Metal Ions

These are metal ions excluding the primary metal ions, namely, metal ions of the lowest valence. Examples of the secondary metal ions are $Cu^{+2}$, $Au^{+3}$, $Tl^{+3}$, $Cr^{+3}$, $Cr^{+6}$, $Mn^{+4}$, $Mn^{+7}$, $Ce^{+4}$, $Rh^{+3}$, $Pb^{+4}$, $Pd^{+2}$, $Pd^{+4}$, $Co^{+3}$, $Ir^{+3}$, $Fe^{+3}$, $Ni^{+3}$, $Sn^{+4}$, $V^{+4}$, $Bi^{+3}$, $Mo^{+3}$, $Mo^{+5}$, $Pt^{+4}$, $Ru^{+4}$, $Te^{+4}$ and $W^{+4}$. These metal ions can be used in the form of water-soluble salts such as halogen salt, nitrate, and sulfate and in case of water-insoluble or sparingly water-soluble salts, there may be used water-miscible organic solvents, for example, alcohols such as methanol, ethanol and isopropanol, dimethylformamide, dioxane and acetone. Water-immiscible organic solvents may also be used.

(2) Halogens

Chlorine, bromine, iodine.

(3) Halogenic Acids

Hypohalogenic acids such as potassium hypochrolite, sodium hypoiodite and sodium hypobromite; halogenic acids such as sodium chlorate, potassium iodate and sodium bromate; perhalogenic acids such as orthoperiodic acid ($H_5IO_6$) and sodium metaperiodate ($NaIO_4$); N-halocarboxylic acid amides such as N-bromoacetamide, N-bromosuccinimide; N-halosulfonamides such as N-chloro-p-toluenesulfonamide (chloramine T) and N-chlorobenzenesulfonamide (chloroamine B); hypohalogenic acid esters such as t-butyl hypochlorite. These may also be used as an aqueous solution or a solution in water-miscible organic solvent or water-immiscible solvent.

(4) Quinones p-Benzoquinone.

Especially preferred are secondary metal ions such as $Cu^{+2}$ (e.g. cupric chloride and copper nitrate), $Au^{+3}$ (e.g., chloroaurate), $Tl^{+3}$ (e.g., thallium (III) nitrate), $Cr^{+6}$ (e.g. potassium chromate), $Mn^{+7}$ (e.g., potassium permanganate), $Fe^{+3}$ (e.g., ferric chloride, ferric sulfate and ferric ethylenediaminetetraacetate), $Co^{+3}$ (cobalt (III) complex as mentioned in Japanese Patent Kokai No. 48-9729), $Pd^{+2}$ (e.g., palladium chloride), $Ni^{+3}$. $Ce^{+4}$ and $Ir^{+3}$.

Amount of the oxidizing agent to be contained in the above processing solution is preferably from about 1% to saturation concentration of the oxidizing agent, more preferably at least about 3% in practical use.

The oleophilic organic compounds used in the present invention are compounds having mercapto group or thion group, for example, those mentioned in Japanese Patent Kokoku No. 48-29723. Examples thereof are those represented by the following formulas:

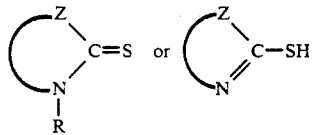

(wherein R represents a hydrogen atom, an aryl group, an aralkyl group or an alkyl group which has 12 or less carbon atoms and Z represents a group of atoms necessary to form a 5- or 6-membered ring together with N and C).

Examples of

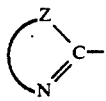

are imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. These rings may be those which are formed by condensation of two or more rings or may be those which condense with a benzene ring or a naphthalene ring.

Typical examples of the compounds are enumerated below.

2-Mercapto-4-phenylimidazole, 2-mercapto-1-benzyl-imidazole, 2-mercapto-benzimidazole, 1-ethyl-2-mercapto-benzimidazole, 2-mercapto-1-butyl-benzimidazole, 1,3-diethyl-benzimidazoline-2-tion, 1,3-dibenzylimidazolidine-2-thion, 2-mercapto-4-phenylthiazole, 2-mercapto-benzothiazole, 2-mercaptonaphthothiazole, 3-ethyl-benzothiazoline-2-thion, 3-dodecyl-benzothiazoline-2-thion, 2-mercapto-4,5-diphenyloxazole, 2-mercaptobenzoxazole, 3-pentyl-benzoxazoline-2-thion, 1-phenyl-3-methylpyrazoline-5-thion, 3-mercapto-4-allyl-5-pentadecyl-1,2,4-triazole, 3-mercapto-5-nonyl-1,2,4-triazole, 2-mercapto-5-phenyl-1,3,4-thiadiazole, 2-mercapto-5-phenyl-1,3,4-oxadiazole, 5-mercapto-1-phenyl-tetravole, 2-mercapto-5-nitropyridine, 1-methyl-luinoline-2(1H)-thion, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine, 3-mercapto-4-benzamido-1,2,4-triazole, 3-mercapto-4-phenylacetamido-5-methyl-1,2,4-triazole, 3-mercapto-4-amino-5-phenyl-1,2,4-triazole, 3-mercapto-4-acetamido-5-heptyl-1,2,4-triazole, 3-mercapto-4-benzamido-5-heptyl-1,2,4-triazole, 3-mercapto-4-phenylacetamido-5-heptyl-1,2,4-triazole, 3-mercapto-4-amino-5-nonyl-1,2,4-triazole, 3-mercapto-4-acetamino-5-nonyl-1,2,4-triazole, 3-mercapto-4-amino-5-pentadecyl-1,2,4-triazole and 3-mercapto-4-acetamino-5-pentadecyl-1,2,4-triazole.

Especially preferred compounds are organic compounds having two or more mercapto groups and example thereof are as follows:

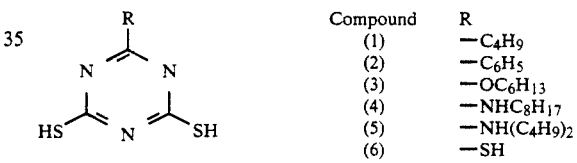

| Compound | R |
|---|---|
| (1) | —$C_4H_9$ |
| (2) | —$C_6H_5$ |
| (3) | —$OC_6H_{13}$ |
| (4) | —$NHC_8H_{17}$ |
| (5) | —$NH(C_4H_9)_2$ |
| (6) | —SH |

Compound (7)          Compound (8)

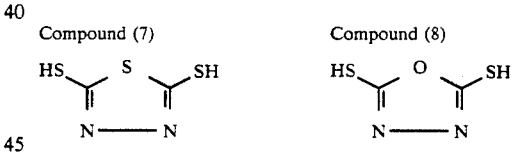

Compound (9)          Compound (10)

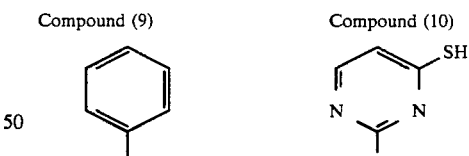

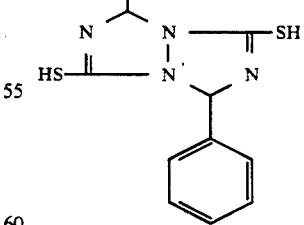

Compound (11)          Compound (12)

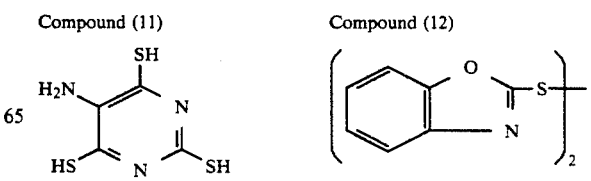

The reason why these organic compounds having two or more mercapto groups are superior to those which have one mercapto group is considered that silver image is partially oxidized with oxidizing agent to form silver ion and the silver ion reacts with —SH group or >C=S group of the organic compounds to form oleophilic silver of crosslinked structure which covers the silver image.

Many of these organic compounds hardly dissolve in water at room temperature. Therefore, they are preferably used in the form of an aqueous solution in hydroxides of alkali metals (NaOH, KOH, LiOH), ammonia, quaternary ammonium salts (pH about 8-10) and/or in the form of a solution in water-miscible organic solvents such as methanol, ethanol, propanol, dimethylformamide, dimethylsulfoxide, acetone, methyl ethyl ketone and tetrahydrofuran. Even in such case, solubility is not equal among the organic compounds and preferably they are used at a solid content of about 5% or less in the present invention.

The oxidizing agent and the oleophilic organic compound are contained in any of processing solution used subsequent to development such as neutralizing solution and etch solution or are used as a specially prepared oil-sensitizing solution. Preferably they are contained in the same processing solution, but may also be contained in separate solutions, respectively.

The lithographic printing plate made by the process of the present invention can be rendered ink-receptive or is enhanced in ink-receptivity by use of such compounds as mentioned in U.S. Pat. No. 3,721,539 or Japanese Patent Kokoku No. 48-29723. The printing method, etch solution (desensitizing solution) and damping solution are similar to those generally known to the art.

The following nonlimiting examples explain the present invention.

EXAMPLE 1

On one side of a subbed polyester film support was provided a matting layer containing silica particles of 5 μ in average particle size. On the opposite side was provided an undercoat layer (adjusted to pH 4.0) containing carbon black and 20% by weight, based on photographic gelatin, of silica powder of 7 μm in average particle size. Onto the undercoat layer was then applied a high sensitivity silver chloroiodobromide emulsion layer (Br: 3 mol%, I: 0.4 mol%, Cl: 96.6 mol% and adjusted to pH 4.0) containing 5% by weight, based on photographic gelatin, of silica powder of 7 μm in average particle size which was chemically sensitized with hypo and a gold compound and then spectrally sensitized.

Amount of gelatin in the undercoat layer was 3.0 g/m$^2$, that of gelatin in the emulsion layer was 1.0 g/m$^2$ and that of silver halide in terms of silver nitrate was 1.0 g/m$^2$. These undercoat layer and the emulsion layer contained formalin as a hardner in an amount of 5.0 mg/g gelatin. After drying, the coated support was heated at 40° C. for 14 days and then on the emulsion layer was coated a nuclei coating composition used in Example 2 of Japanese Patent Kokai No. 53-21602 (polymer was an acrylamide and imidazole copolymer of No. 3 and hydroquinone was contained in an amount of 0.8 g/m$^2$) and dried to make a light-sensitive material for lithographic printing plate. The silver halide emulsion contained $5 \times 10^{-6}$ mol of rhodium chloride per 1 mol of silver halide, which had been added during physical ripening. The silver halide grains, in substantially cubic form, were 0.35 micron in average grain size and 90% or more of the total grains were distributed within ±30% of the average grain size.

As a sensitizing dye, dye (10) enumerated above was added in an amount of $5 \times 10^{-4}$ mol per 1 mol of silver halide. The obtained light-sensitive material for lithographic printing plate was Comparative Sample (a). Separately, light-sensitive materials for lithographic printing plates of the present invention [Present Samples (A)-(C)] were prepared in the same manner as in preparation of Comparative Sample (a) except that an intermediate layer of lime-treated gelatin at a coverage of 0.1 g/m$^2$ [Present Sample (A)], at a coverage of 0.2 g/m$^2$ [Present Sample (B)] or at a coverage of 0.4 g/m$^2$ [Present Sample (C)] was coated together with the emulsion layer and the undercoat layer. The intermediate layer contained a hardener and surfactant and was adjusted to pH 4.5.

These light-sensitive materials for lithographic printing plate were imagewise exposed by a semiconductor laser exposing device (Ultra setter of Ultre Co. in U.S.A.) and these were employed as samples for printing test.

Separately, the above light-sensitive materials were subjected to flash exposure through an optical wedge to a light source attached with a dark red filter (SC-70) for $10^{-5}$. The resulting materials were employed as samples for sensitometry.

The exposed materials were developed with the following diffusion transfer developer.

Diffusion Transfer Developer

| Water | 700 ml |
|---|---|
| Sodium hydroxide | 18 g |
| Potassium hydroxide | 7 g |
| Anhydrous sodium sulfite | 50 g |
| 2-Mercaptobenzoic acid | 1.5 g |
| 2-Methylamino ethanol | 15 g |
| Water to make up 1 liter. | |

After development the materials were passed through a pair of squeeze rolls to remove the excess developer, then immediately treated with at 25° C. for 20 seconds with the following neutralizing solution and dried at room temperature.

Neutralizing Solution

| Water | 600 ml |
|---|---|
| Citric acid | 10 g |
| Sodium citrate | 35 g |
| Colloidal silica (20% solution) | 5 ml |
| Ethylene glycol | 5 ml |
| Water added to make up 1 liter. | |

Sensitivity and printing endurance of the materials are shown in Table 1. The sensitivity was exposure amount required before the precipitation of the transferred silver had no more been observed and expressed as a relative value by assuming the sensitivity of the Comparative Sample (a) to be 1.0. The printing endurance was evaluated in the following manner: That is, each sample was pasted onto one sheet and this sheet was mounted on an offset printing machine and applied with the following etch solution all over the plate surface, and printing was carried out using the following damping solution. The printing machine employed was A.B. Dick 350 CD (Trade mark for an offset printing machine manufactured by A.B. Dick Co.). The printing endurance was evaluated in terms of the number of copies delivered before the printing had become impossible owing to the occurrence of scumming or disappearance of silver image and expressed in grade number rated in accordance with the following criteria.

| Grade No. | Number of copies |
| --- | --- |
| 1 | <4,000 |
| 2 | 4,000–6,000 |
| 3 | 6,000–8,000 |
| 4 | 8,000–10,000 |
| 5 | >10,000 |

Etch Solution

| Water | 600 ml |
| --- | --- |
| Isopropyl alcohol | 400 ml |
| Ethylene glycol | 50 g |
| 3-Mercapto-4-acetamide-5-n-heptyl-1,2,4-triazol | 1 g |

Damping Solution

| o-Phosphoric acid | 10 g |
| --- | --- |
| Nickel phosphate | 5 g |
| Sodium sulfite | 5 g |
| Ethylene glycol | 100 g |
| Colloidal silica (20% solution) | 28 g |
| Water to make up 2 liters. | |

TABLE 1

| Printing plate | Relative sensitivity | Printing endurance |
| --- | --- | --- |
| Comparative Sample (a) | 1.0 | 5 |
| Present Sample (A) | 1.2 | 5 |
| Present Sample (B) | 1.3 | 5 |
| Present Sample (C) | 1.5 | 5 |

The lithographic printing plates of the Present Samples (A)–(C) were higher in contrast (especially sharp in foot part), higher in sensitivity and better in printing endurance as compared with the Comparative Sample (a). Furthermore, these lithographic printing plates were stored for 5 days at 50° C. and 80%RH and thereafter similarly subjected to sensitometry test. It was found that the Comparative Sample (a) showed desensitization of 40% while the Present Samples (A), (B) and (C) showed desensitization of 25%, 20% and 10%, respectively and were improved in shelf stability.

EXAMPLE 2

A silver chloride emulsion of 0.4 micron in average grain size was prepared by adding $3 \times 10^{-6}$ mol of potassium hexachloroiridate (IV) per 1 mol of silver halide at the formation of silver halide. A light-sensitive material for lithographic printing plate was prepared using the above emulsion in the same manner as in production of the Comparative Sample (a) in Example 1 except that the aforementioned dye No. (3) was added as a sensitizing dye in an amount of $3 \times 10^{-4}$ mol per 1 mol of silver halide and a polyethylene-laminated paper support was used. The resulting material was Comparative Sample (b).

Separately, light-sensitive materials for lithographic printing plate where a lime-treated gelatin intermediate layer was provided between the emulsion layer and the nuclei layer at a coverage of 0.2 g/m$^2$ [Present Sample (D)],0.4 g/m$^2$ [Present sample (E)] or 0.8 g/m$^2$ [Present Sample (F)] were prepared in the same manner as in production of Comparative Sample (b).

These materials were subjected to flash exposure of $10^{-6}$ second and the development according to Example 1 and sensitivity and gradation were evaluated. Sensitivity of Comparative Sample (b) was 1.0 while that of Present Sample (D) was 1.3, that of Present Sample (E) was 1.6 and that of Present Sample (F) was 2.1. Thus, Present Samples (D)–(F) were all higher in contrast than Comparative Sample (b).

The similar results were recognized also in case of scanning exposure by helium-neon laser.

EXAMPLE 3

Comparative Sample (a') was made in the same manner as in making of Comparative Sample (a) in Example 1 except that dye No. (13) was used as the sensitizing dye and further, Present Samples (A')–(C') were made in the same manner as in making Present Samples (A)–(B) in Example 1 except that coverage of the intermediate layer of lime-treated gelatin was 0.5 g/m$^2$ [Sample (A')], 1.0 g/m$^2$ [Sample (B')] and 1.5 g/m$^2$ [sample (C')] (The above procedure was called Plate-making method I). Printing endurance of the resulting printing plates was evaluated in terms of the number of copies delivered before the printing had become impossible owing to the occurrence of scumming or disappearance of silver image and expressed in accordance with the following criteria and shown in Table 2.

| Grade No. | Number of copies |
| --- | --- |
| 1 | <5,000 |
| 2 | 5,000–10,000 |
| 3 | 10,000–20,000 |
| 4 | >20,000 |

Furthermore, samples were made in the same manner as the Plate-making method I except that 70 g of ferric ethylenediaminetetraacetate was added to the etch solution. This method was called Plate-making method II. Evaluation was effected in the same manner. The results are also shown in Table 2. The sensitivity was expressed as a relative value by assuming the sensitivity of printing Sample (a') to be 100.

TABLE 2

| | | Printing endurance | | | |
| --- | --- | --- | --- | --- | --- |
| | | Platemaking method I | | Platemaking method II | |
| Printing plate | Relative sensitivity | Disappearance of silver | Scumming | Disappearance of silver | Scumming |
| Sample (a') | 100 | 2 | 4 | 3 | 2 |
| Sample (A') | 150 | 1 | 4 | 3 | 4 |
| Sample (B') | 190 | 1 | 4 | 3 | 4 |

TABLE 2-continued

| Printing plate | Relative sensitivity | Printing endurance | | | |
|---|---|---|---|---|---|
| | | Platemaking method I | | Platemaking method II | |
| | | Disappearance of silver | Scumming | Disappearance of silver | Scumming |
| Sample (C') | 230 | 1 | 4 | 2 | 4 |

The samples (A')-(C') of the present invention were higher in contrast (especially sharp in foot part) and higher in sensitivity as compared with the Comparative Sample (a'). Further, printing endurance was improved by making the printing plate according to Plate-making method II.

Furthermore, these lithographic printing plates were stored for 5 days at 50° C. and 80%RH and thereafter similarly subjected to sensitometry test. It was found that the Comparative Sample (a') showed much desensitization while the Present Samples (A')-(C') showed substantially no desensitization.

EXAMPLE 4

A silver chloride emulsion of 0.4 micron in average grain size was prepared by adding $3 \times 10^{-6}$ mol of potassium hexachloroiridate (IV) per 1 mol of silver halide at the formation of silver halide. A light-sensitive material for lithographic printing plate was prepared using the above emulsion in the same manner as in Example 3 except that the aforementioned dye No. (3) was added as a sensitizing dye in an amount of $3 \times 10^{-4}$ mol per 1 mol of silver halide and a polyethylene-laminated paper support was used. The resulting materials were Comparative Sample (a'') and Present Samples (A'')-(C'').

These samples were subjected to flash exposure of $10^{-6}$ second and the development according to Example 3 and photographic characteristic were evaluated. Furthermore, plate-making and printing were effected in the same manner as in Example 3 except that imagewise exposure was carried out by helium-neon laser scanner and the compound (6) was used as the mercapto compound in the etch solution. The results are shown in Table 3.

TABLE 3

| Printing plate | Relative sensitivity | Printing endurance | | | |
|---|---|---|---|---|---|
| | | Platemaking method I | | Platemaking method II | |
| | | Disappearance of silver | Scumming | Disappearance of silver | Scumming |
| Sample (a'') | 100 | 2 | 4 | 4 | 2 |
| Sample (A'') | 140 | 1 | 4 | 4 | 4 |
| Sample (B'') | 170 | 1 | 4 | 4 | 4 |
| Sample (C'') | 190 | 1 | 4 | 3 | 4 |

The results were similar to those in Example 3. It was seen that printing endurance was markedly improved by using compound (6).

As explained above, according to the present invention, lithographic printing plates of high sensitivity, high contrast and high printing endurance can be made in accordance with plate-making method including high-intensity short-time exposure such as with laser beam.

What is claimed is:

1. A light-sensitive material for making a lithographic printing plate by semiconductor laser exposure which comprises a support and, provided thereon, at least a silver halide emulsion layer and a physical development nuclei layer wherein an intermediate layer comprising a water-permeable film-forming polymer of gelatin is provided between the emulsion layer and the nuclei layer, and wherein said emulsion layer comprises a sensitizing dye selected from the group consisting of formulas II, III, IV and V.

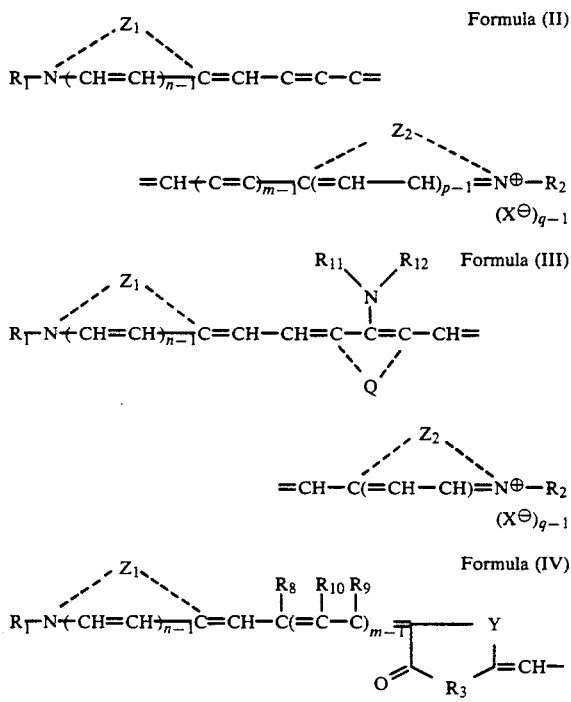

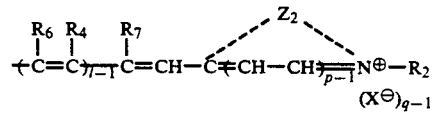

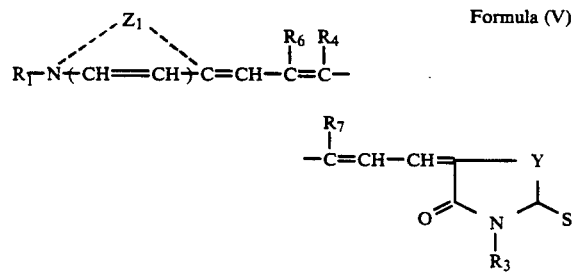

wherein $Z_1$ and $Z_2$ may be identical or different and each represents a group of atoms necessary to form a 5- or 6-membered nitrogen-containing hetreocyclic ring; wherein $R_1$ and $R_2$ may be identical or different and each represents an alkenyl group; wherein $R_3$ represents an alkyl group, an alkenyl group or an aryl group; wherein $R_4$–$R_{10}$ may be identical or different and each represents a hydrogen atom, a halogen atom, an alkyl group, an aryl group or an alkoxy group and wherein $R_6$ and $R_7$ or $R_8$ and $R_9$ may link to each other to form a 5- or 6-membered ring; wherein $R_{11}$ and $R_{12}$ may be identical or different and each represents an alkyl group or an aryl group and $R_{11}$ and $R_{12}$ may link to each other to form a 5- or 6-membered ring; wherein Y represents a sulfur atom, an oxygen atom or N-$R_{13}$ ($R_{13}$ is an alkyl gorup); wherein Q represents a group of atoms necessary to form a 5- or 6-membered ring; wherein X represents an acid anion; and wherein l, m, n, p and q each represents 1 or 2.

2. A light-sensitive material according to claim 1 wherein amount of the water-permeable film forming polymer is about 0.01 g to about 2 g/m².

3. A light-sensitive material according to claim 1 wherein the silver halide emulsion layer is spectrally sensitized with a sensitizing dye.

4. A method of printing which comprises subjecting the light sensitive material of claim 1 to image-wise exposure with laser beam, then to silver complex diffusion transfer development and subsequently to printing.

5. A process for making a lithographic printing plate which comprises subjecting the light-sensitive material of claim 1 to imagewise exposure of high intensity short time, silver complex diffusion transfer development and subsequently treatment with an oxidizing agent for silver and an oleophilic organic compound.

6. A process according to claim 5 wherein the oxidizing agent for silver is selected from the group consisting of a secondary metal ion, a halogen, a halogenic acid and a quinone.

7. A process according to claim 5 wherein the oleophilic organic compound is a compound having mercapto group or thion group.

8. A process according to claim 5 wherein the light-sensitive material is subjected to imagewise exposure with laser beam.

9. A process according to claim 7 wherein the oleophilic compound has at least two mercapto groups or thion group.

10. A process according to claim 5 wherein in the oleophilic organic compound is represented by the following formula:

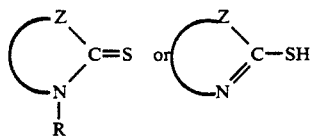

wherein R represent a hydrogen atom, an aryl group, an aralkyl group or an alkyl group which has 12 or less carbon atoms and Z represent a group of atoms necessary to form a 5- or 6-membered ring together with N and C.

11. A process for making a lithographic printing plate by semiconductor laser which comprises subjecting a light sensitive material comprising a support and, provided thereon, at least a silver halide emulsion layer and a physical development nuclei layer wherein an intermediate layer comprising 0.05 g to about 1.5 g/m² of a water-permeable film-forming polymer of gelatin is provided between the emulsion layer and the nuclei layer to imagewise exposure with a semiconductor laser beam and silver complex diffusion transfer development, and wherein said emulsion layer comprises a sensitizing dye selected from the group consisting of formulas II, III, IV and V,

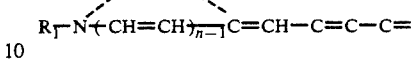
Formula (II)

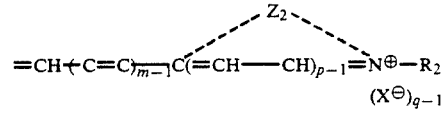

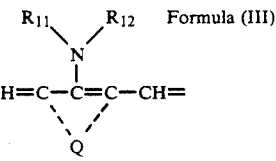
Formula (III)

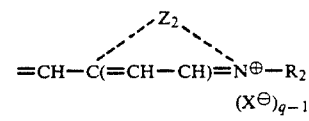

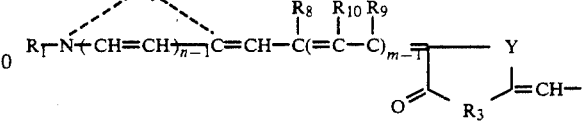
Formula (IV)

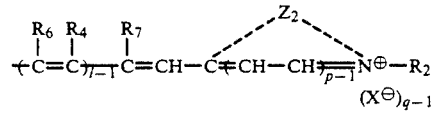

Formula (V)

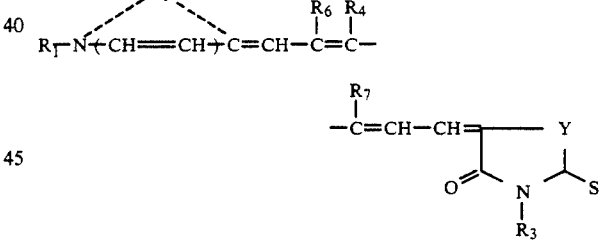

wherein $Z_1$ and $Z_2$ may be identical or different and each represents a group of atoms necessary to form a 5- or 6-membered nitrogen-containing heterocyclic ring; wherein $R_1$ and $R_2$ may be identical or different and each represents an alkenyl group; wherein $R_3$ represents an alkyl group, an alkenyl group or an aryl group; wherein $R_4$–$R_{10}$ may be identical or different and each represents a hydrogen atom, a halogen atom, an alkyl group, an aryl group or an alkoxy group and wherein $R_4$ and $R_7$ or $R_4$ and $R_9$ may link to each other to form a 5- or 6-membered ring; wherein $R_{11}$ and $R_{12}$ may be identical or different and each represents an alkyl group or an aryl group and $R_{11}$ and $R_{12}$ may link to each other to form a 5- or 6-membered ring; wherein Y represents a sulfur atom, an oxygen atom or N-$R_{13}$ ($R_{13}$ is an alkyl group); wherein Q represents a group of atoms necessary to form a 5- or 6-membered ring; wherein X represents an acid anion; and wherein l, m, n, p and q each represents 1 or 2.

* * * * *